United States Patent
Li

(10) Patent No.: US 12,381,078 B2
(45) Date of Patent: Aug. 5, 2025

(54) METHOD FOR REDUCING LOSS OF DIELECTRIC LAYER IN IO SILICON OXIDE REMOVAL PROCESS

(71) Applicant: Shanghai Huali Integrated Circuit Corporation, Shanghai (CN)

(72) Inventor: Zhenquan Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 414 days.

(21) Appl. No.: 18/125,294

(22) Filed: Mar. 23, 2023

(65) Prior Publication Data

US 2024/0071760 A1 Feb. 29, 2024

(30) Foreign Application Priority Data

Aug. 25, 2022 (CN) .......................... 202211022405.6

(51) Int. Cl.
| | |
|---|---|
| H01L 21/02 | (2006.01) |
| H01L 21/3105 | (2006.01) |
| H01L 21/762 | (2006.01) |
| H01L 21/768 | (2006.01) |

(52) U.S. Cl.
CPC .. *H01L 21/02639* (2013.01); *H01L 21/02126* (2013.01); *H01L 21/3105* (2013.01); *H01L 21/76224* (2013.01); *H01L 21/76829* (2013.01)

(58) Field of Classification Search
None
See application file for complete search history.

(56) References Cited

U.S. PATENT DOCUMENTS

2024/0071760 A1* 2/2024 Li ..................... H01L 21/02639

* cited by examiner

*Primary Examiner* — Jack S Chen
(74) *Attorney, Agent, or Firm* — Banner & Witcoff, Ltd.

(57) ABSTRACT

The present application provides a method for reducing a loss of a dielectric layer in an IO silicon oxide removal process, a plurality of gate structures arranged on a silicon bulk and spaced apart from each other, and an IO silicon oxide layer located between the bottom of the gate structure and the silicon bulk; depositing an etch stop layer; the gate structure being composed of a polysilicon structure, a first hard mask layer, and a second hard mask layer stacked from bottom to top; depositing a first dielectric layer to fill a space between the gate structures; performing etch back of the first dielectric layer; depositing a silicon nitride layer to continuously cover an upper surface of the first dielectric layer and an upper surface of the exposed etch stop layer; depositing a second dielectric layer on the silicon nitride layer.

11 Claims, 5 Drawing Sheets

Step 1. A semiconductor structure is provided, the semiconductor structure including: a silicon bulk, a plurality of gate structures arranged on the silicon bulk and spaced apart from each other, an IO silicon oxide layer located between the bottom of the gate structure and an upper surface of the silicon bulk, and a spacer attached to a side wall of the gate structure; and an etch stop layer is deposited, the etch stop layer covering, in a manner of continuous distribution, the spacer of the side wall of the gate structure, the top of the gate structure, and the upper surface of the silicon bulk between the gate structures, the gate structure being composed of a polysilicon structure, a first hard mask layer, and a second hard mask layer stacked from bottom to top Step 2. A first dielectric layer is deposited to fill a space between the gate structures, and then planarization is performed to expose the etch stop layer on the top of the gate structure Step 3. Etch back of the first dielectric layer is performed until the height of the remaining first dielectric layer is two-thirds of the height of the polysilicon structure Step 4. A silicon nitride layer is deposited to continuously cover an upper surface of the first dielectric layer and an upper surface of the exposed etch stop layer Step 5. A second dielectric layer is deposited on the silicon nitride layer to fill the space between the gate structures, and then planarization is performed to expose the silicon nitride layer on the top of the gate structure Step 6. Non-selective etch back is performed to remove the second dielectric layer and the gate structure, the spacer, the etch stop layer, and the silicon nitride layer which are covered by the second dielectric layer, wherein the first dielectric layer, the silicon nitride layer on the upper surface of the first dielectric layer, and the polysilicon structure, the spacer, and the etch stop layer between the first dielectric layers are retained Step 7. The remaining polysilicon structure is removed to form a groove, wherein the IO silicon oxide layer is exposed from the bottom of the groove Step 8. The IO silicon oxide layer is removed, wherein the silicon nitride layer covering the upper surface of the first dielectric layer serves as a hard mask such that no loss of the first dielectric layer occurs in a process of removing the IO silicon oxide layer

FIG. 9

METHOD FOR REDUCING LOSS OF DIELECTRIC LAYER IN IO SILICON OXIDE REMOVAL PROCESS

CROSS-REFERENCE TO RELATED APPLICATIONS

This application claims priority to Chinese patent application No. 202211022405.6, filed on Aug. 25, 2022, the disclosure of which is incorporated herein by reference in its entirety.

TECHNICAL FIELD

The present application relates to the technical field of semiconductors, in particular to a method for reducing a loss of a dielectric layer in an IO silicon oxide removal process.

BACKGROUND

Before the deposition of a current high dielectric constant film, silicon oxide on a component in the original non-input/output (IO) region is removed. A loss of a dielectric layer (silicon oxide) occurs because the dielectric layer is exposed during this process. In particular, when over etch of the silicon oxide on the component in the non-IO region is required to ensure full removal, the loss of the dielectric layer leads to a loss of the overall gate height.

BRIEF SUMMARY

In view of the above defect in the prior art, the objective of the present application is to provide a method for reducing a loss of a dielectric layer in an IO silicon oxide removal process, so as to solve the problem of in the prior art.

In order to achieve the above objective and other related objectives, the present application provides a method for reducing a loss of a dielectric layer in an IO silicon oxide removal process, at least including the following steps:
- step 1, providing a semiconductor structure, the semiconductor structure including: a silicon bulk, a plurality of gate structures arranged on the silicon bulk and spaced apart from each other, an IO silicon oxide layer located between the bottom of the gate structure and an upper surface of the silicon bulk, and a spacer attached to a side wall of the gate structure;
and depositing an etch stop layer, the etch stop layer covering, in a manner of continuous distribution, the spacer of the side wall of the gate structure, the top of the gate structure, and the upper surface of the silicon bulk between the gate structures, the gate structure being composed of a polysilicon structure, a first hard mask layer, and a second hard mask layer stacked from bottom to top;
- step 2, depositing a first dielectric layer to fill a space between the gate structures, and then performing planarization to expose the etch stop layer on the top of the gate structure;
- step 3, performing etch back of the first dielectric layer until the height of the remaining first dielectric layer is two-thirds of the height of the polysilicon structure;
- step 4, depositing a silicon nitride layer to continuously cover an upper surface of the first dielectric layer and an upper surface of the exposed etch stop layer;
- step 5, depositing a second dielectric layer on the silicon nitride layer to fill the space between the gate structures, and then performing planarization to expose the silicon nitride layer on the top of the gate structure;
- step 6, performing non-selective etch back to remove the second dielectric layer and the gate structure, the spacer, the etch stop layer, and the silicon nitride layer which are covered by the second dielectric layer, wherein the first dielectric layer, the silicon nitride layer on the upper surface of the first dielectric layer, and the polysilicon structure, the spacer, and the etch stop layer between the first dielectric layers are retained;
- step 7, removing the remaining polysilicon structure to form a groove, wherein the IO silicon oxide layer is exposed from the bottom of the groove; and
- step 8, removing the IO silicon oxide layer, wherein the silicon nitride layer covering the upper surface of the first dielectric layer serves as a hard mask such that no loss of the first dielectric layer occurs in a process of removing the IO silicon oxide layer.

According to some embodiments, in step 1, the first hard mask layer is silicon nitride; and the second hard mask layer is silicon oxide.

According to some embodiments, in step 1, the spacer attached to the side wall of the gate structure is composed of a first spacer and a second spacer attached to the first spacer.

According to some embodiments, in step 1, the first spacer and the second spacer are both silicon nitride.

According to some embodiments, in step 1, a side wall of the first hard mask layer is fully covered by the first spacer and the second spacer; and a side wall of an upper end portion of the second hard mask layer is not covered by the first spacer or the second spacer.

According to some embodiments, in step 1, portions of the top of the gate structure covered by the etch stop layer include: an upper surface of the gate structure and a side wall of a top end portion of the gate structure which are covered by the etch stop layer; and the above etch stop layer joins the etch stop layer covering the second spacer.

According to some embodiments, in step 1, the etch stop layer is silicon nitride.

According to some embodiments, in step 2, the first dielectric layer is silicon oxide; and a method of the planarization is a chemical mechanical polishing method.

According to some embodiments, in step 5, the second dielectric layer is silicon oxide.

According to some embodiments, in step 6, after the non-selective etch back for removing the second dielectric layer, the retained silicon nitride layer on the upper surface of the first dielectric layer forms a concave structure, and the second dielectric layer within the concave structure is retained.

According to some embodiments, in step 8, the second dielectric layer within the concave structure is removed at the same time when the JO silicon oxide layer is removed.

As stated above, the method for reducing a loss of a dielectric layer in an JO silicon oxide removal process of the preset application has the following beneficial effects: according to the present application, a silicon nitride hard mask is formed on the first dielectric layer to prevent the loss of the first dielectric layer in a process of removing the JO silicon oxide layer, thus avoiding a loss of the gate height.

BRIEF DESCRIPTION OF THE DRAWINGS

FIG. 9 is a flowchart of the method for reducing a loss of a dielectric layer in an IO silicon oxide removal process according to the present application.

DETAILED DESCRIPTION OF THE DISCLOSURE

The embodiments of the present application are described below using specific examples, and those skilled in the art can easily understand other advantages and effects of the present application from the contents disclosed in the Description. The present application can also be implemented or applied using other different specific embodiments, and various details in the Description can also be modified or changed based on different viewpoints and applications without departing from the spirit of the present application.

Please refer to FIGS. 1-9. It should be noted that the drawings provided in this embodiment are only used to illustrate the basic concept of the present application in a schematic way, so the drawings only show the components related to the present application rather than being drawn according to the number, shape and size of the components in actual implementation. The type, number and proportion of various components can be changed randomly during actual implementation, and the layout of components may be more complicated.

The present application provides a method for reducing a loss of a dielectric layer in an IO silicon oxide removal process. Referring to FIG. 9, FIG. 9 is a flowchart of the method for reducing a loss of a dielectric layer in an IO silicon oxide removal process according to the present application. The method at least includes the following steps.

Step 1. A semiconductor structure is provided, the semiconductor structure including: a silicon bulk, a plurality of gate structures arranged on the silicon bulk and spaced apart from each other, an IO silicon oxide layer located between the bottom of the gate structure and an upper surface of the silicon bulk, and a spacer attached to a side wall of the gate structure.

Figure 1:
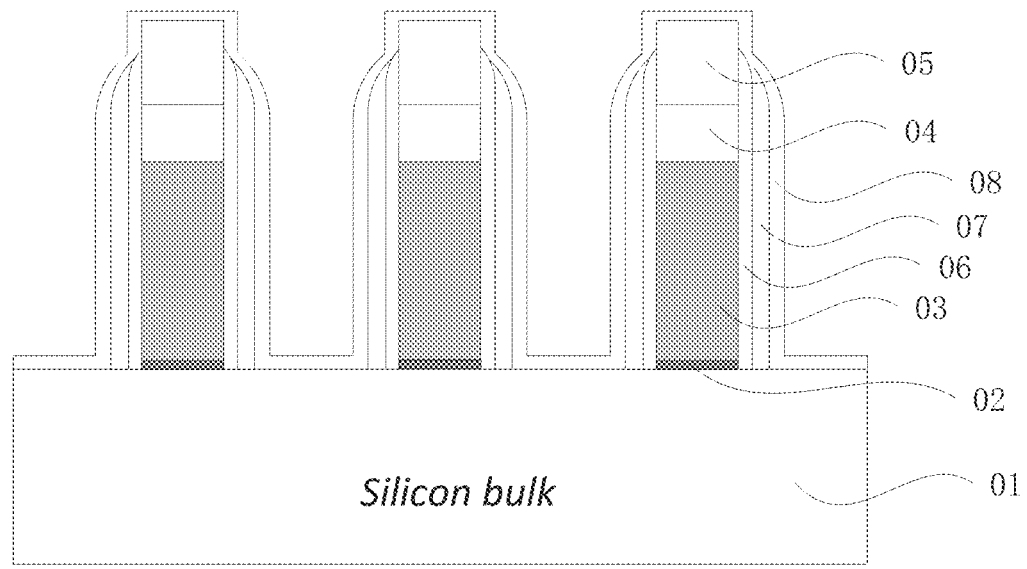
FIGS. 1-8 are schematic diagrams of structures in various steps of a method for reducing a loss of a dielectric layer in an IO silicon oxide removal process according to the present application.

An etch stop layer is deposited, the etch stop layer covering, in a manner of continuous distribution, the spacer of the side wall of the gate structure, the top of the gate structure, and the upper surface of the silicon bulk between the gate structures, the gate structure being composed of a polysilicon structure, a first hard mask layer, and a second hard mask layer stacked from bottom to top. Referring to FIG. 1, in step 1, the semiconductor structure 01 is provided, the semiconductor structure including: a silicon bulk 01, a plurality of gate structures arranged on the silicon bulk 01 and spaced apart from each other, an IO silicon oxide layer 02 located between the bottom of the gate structure and an upper surface of the silicon bulk 01, and a spacer attached to a side wall of the gate structure.

Referring to FIG. 1, in step 1, the etch stop layer 08 is deposited, the etch stop layer 08 covering, in a manner of continuous distribution, the spacer of the side wall of the gate structure, the top of the gate structure, and the upper surface of the silicon bulk 01 between the gate structures, the gate structure being composed of a polysilicon structure 03, a first hard mask layer 04, and a second hard mask layer 05 stacked from bottom to top. According to this embodiment, in step 1, the spacer attached to the side wall of the gate structure is composed of a first spacer 06 and a second spacer 07 attached to the first spacer 06. That is, the etch stop layer 08 covers, in a manner of continuous distribution, the second spacer 07, the top of the second hard mask layer 05, and the upper surface of the silicon bulk 01 between the gate structures.

According to this embodiment, in step 1, the first hard mask layer 04 is silicon nitride; and the second hard mask layer 05 is silicon oxide. Still according to this embodiment, in step 1, the first spacer 06 and the second spacer 07 are both silicon nitride. According to this embodiment, in step 1, a side wall of the first hard mask layer 04 is fully covered by the first spacer 06 and the second spacer 07; and a side wall of an upper end portion of the second hard mask layer 05 is not covered by the first spacer 06 or the second spacer 07.

According to this embodiment of the present application, in step 1, portions of the top of the gate structure covered by the etch stop layer 08 include: an upper surface of the gate structure and a side wall of a top end portion of the gate structure which are covered by the etch stop layer 08 (that is, the etch stop layer 08 covers an upper surface of and a side wall of an upper end portion of the second hard mask layer 05); and the above etch stop layer joins the etch stop layer covering the second spacer 07. According to this embodiment, in step 1, the etch stop layer 08 is silicon nitride.

Step 2. A first dielectric layer is deposited to fill a space between the gate structures, and then planarization is performed to expose the etch stop layer on the top of the gate structure.

According to this embodiment of the present application, in step 2, the first dielectric layer is silicon oxide; and a method of the planarization is a chemical mechanical polishing method.

Figure 2:
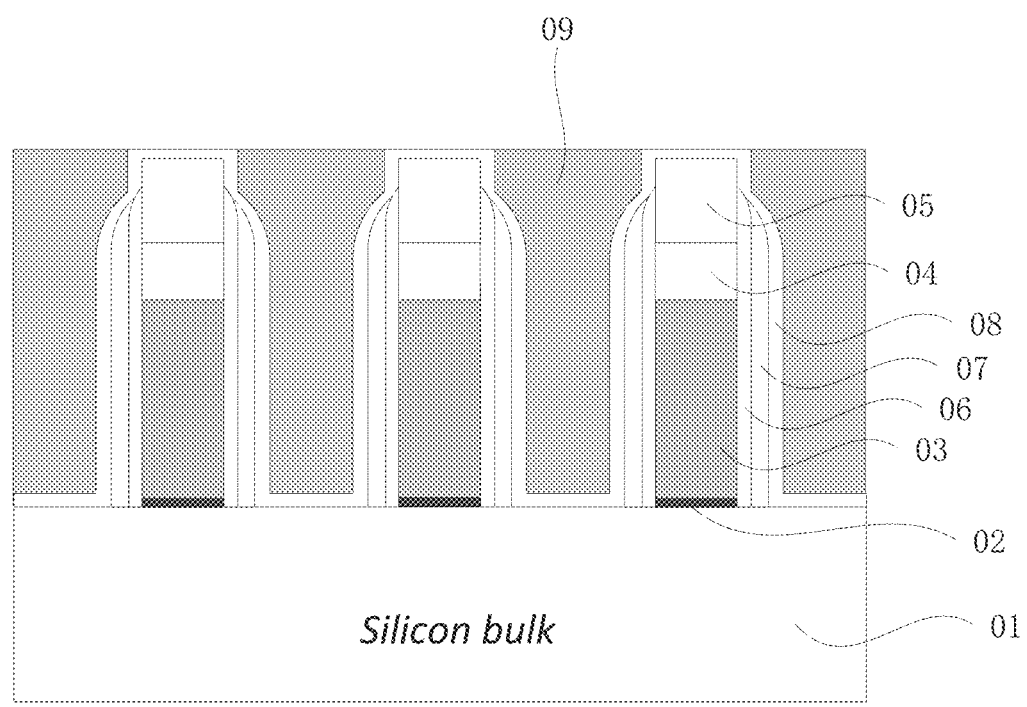

Referring to FIG. 2, in step 2, the first dielectric layer 09 is deposited to fill the space between the gate structures, and then the planarization is performed on the first dielectric layer to expose the etch stop layer on the top of the gate structure (i.e. on an upper surface of the second hard mask layer 05).

Figure 3:
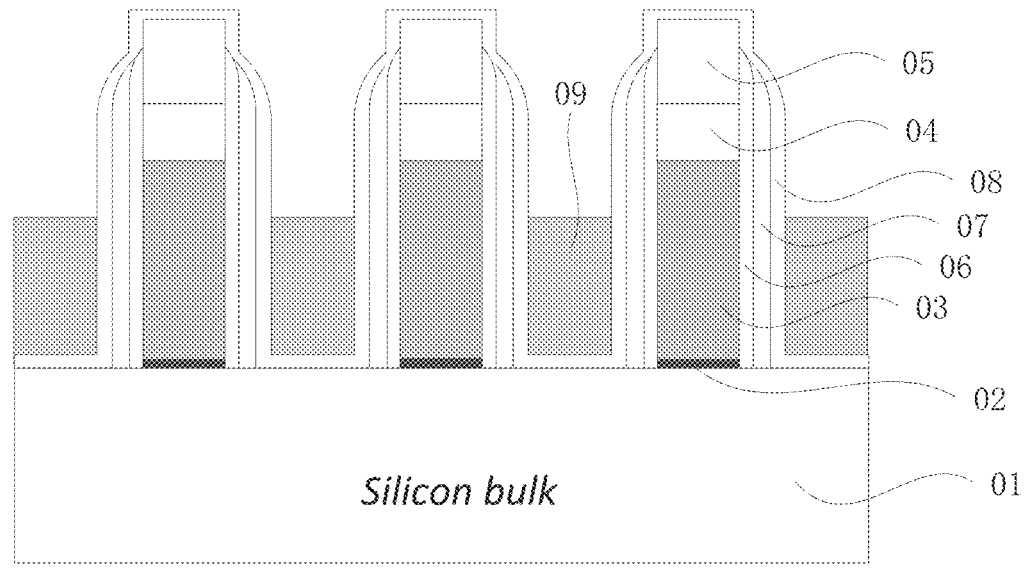

Step 3. Etch back of the first dielectric layer is performed until the height of the remaining first dielectric layer is two-thirds of the height of the polysilicon structure. Referring to FIG. 3, in step 3, the etch back of the first dielectric layer 09 is performed until the height of the remaining first dielectric layer 09 is two-thirds of the height of the polysilicon structure 03. In other words, a distance from the bottom of the first dielectric layer 09 (an upper surface of the etch stop layer) to the top of same is two-thirds of a distance from the bottom of the polysilicon structure 03 (an upper surface of the IO silicon oxide layer 02) to the top of same.

Figure 4:
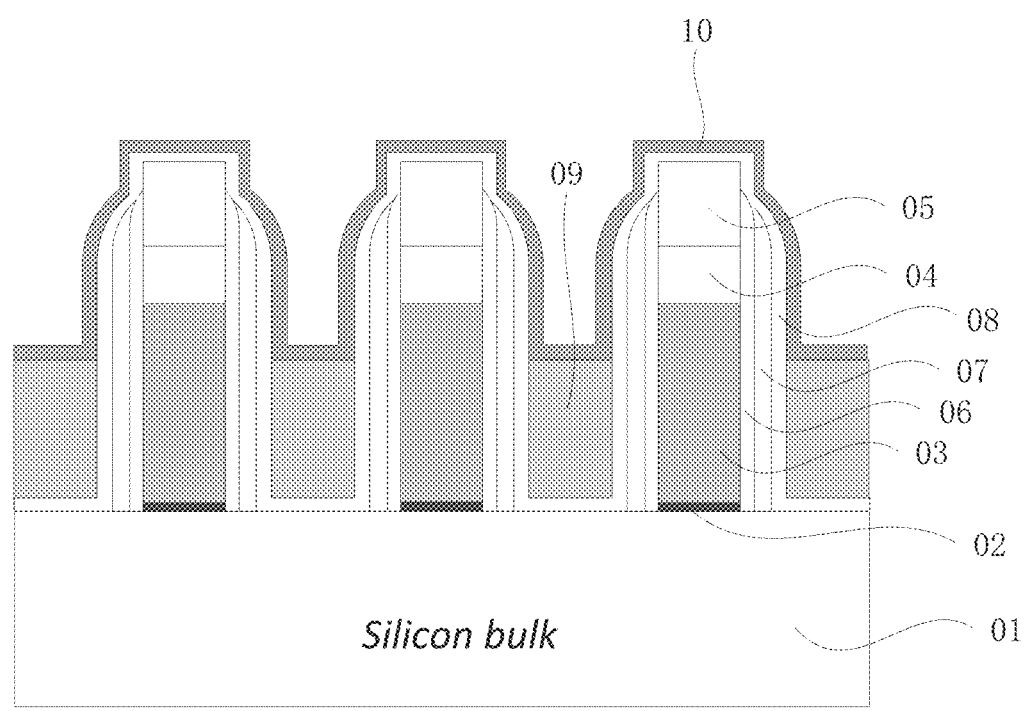

Step 4. A silicon nitride layer is deposited to continuously cover an upper surface of the first dielectric layer and an upper surface of the exposed etch stop layer. Referring to FIG. 4, in step 4, the silicon nitride layer 10 is deposited to continuously cover the upper surface of the first dielectric layer 09 and the upper surface of the exposed etch stop layer 08.

Figure 5:
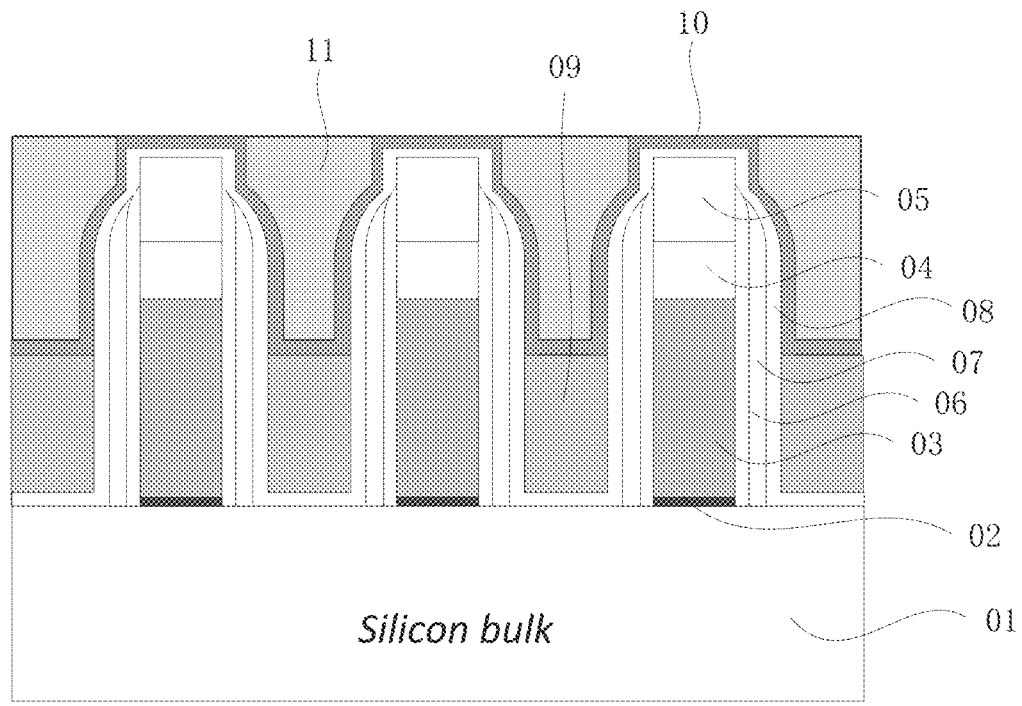

Step 5. A second dielectric layer is deposited on the silicon nitride layer to fill the space between the gate structures, and then planarization is performed to expose the silicon nitride layer on the top of the gate structure. Referring to FIG. 5, in step 5, the second dielectric layer 11 is deposited on the silicon nitride layer 10 to fill the space between the gate structures, and then planarization is performed on the second dielectric layer 11 to expose the silicon nitride layer 10 on the top of the gate structure. According to this embodiment of the present application, in step 5, the second dielectric layer 11 is silicon oxide.

Figure 6:
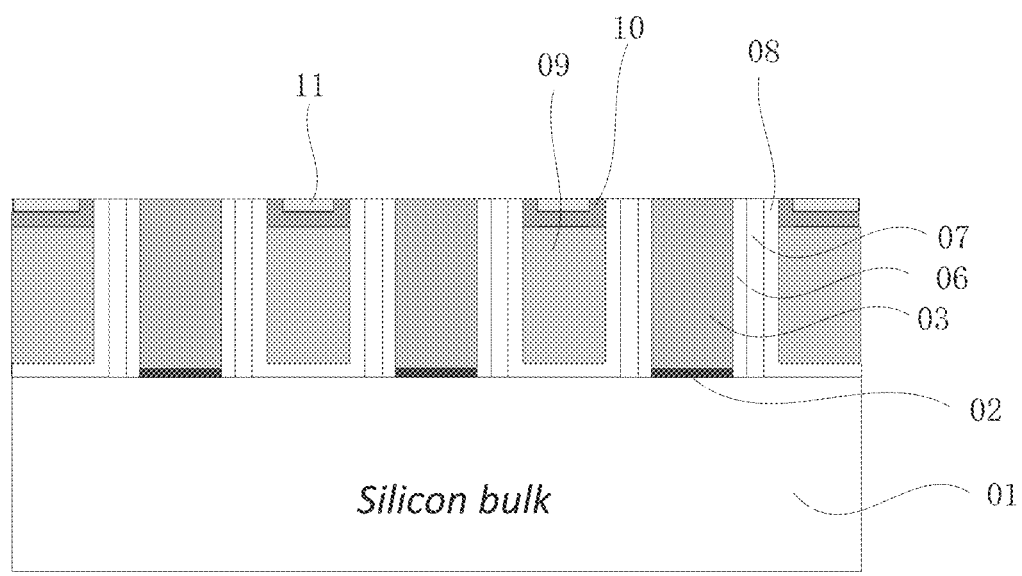

Step 6. Non-selective etch back is performed to remove the second dielectric layer and the gate structure, the spacer, the etch stop layer, and the silicon nitride layer which are covered by the second dielectric layer, wherein the first dielectric layer, the silicon nitride layer on the upper surface of the first dielectric layer, and the polysilicon structure, the spacer, and the etch stop layer between the first dielectric layers are retained. Referring to FIG. 6, in step 6, the non-selective etch back (i.e., cutting off layers of different materials from top to bottom at the same etching rate) is performed to remove the second dielectric layer 11 and the gate structure, the spacer, the etch stop layer 08, and the silicon nitride layer 10 which are covered by the second dielectric layer 11 (that is, all other material layers at the same height as the removed second dielectric layer are removed, referring to FIG. 6), wherein the first dielectric layer 09, the silicon nitride layer 10 on the upper surface of the first dielectric layer 09, and the polysilicon structure 03, the spacer (including the first spacer and the second spacer), and the etch stop layer 08 between the first dielectric layers 09 are retained.

Referring to FIG. 6, according to this embodiment of the present application, in step 6, after the non-selective etch back for removing the second dielectric layer 11, the retained silicon nitride layer 10 on the upper surface of the first dielectric layer 09 forms a concave structure, and the second dielectric layer 11 within the concave structure is retained.

Figure 7:
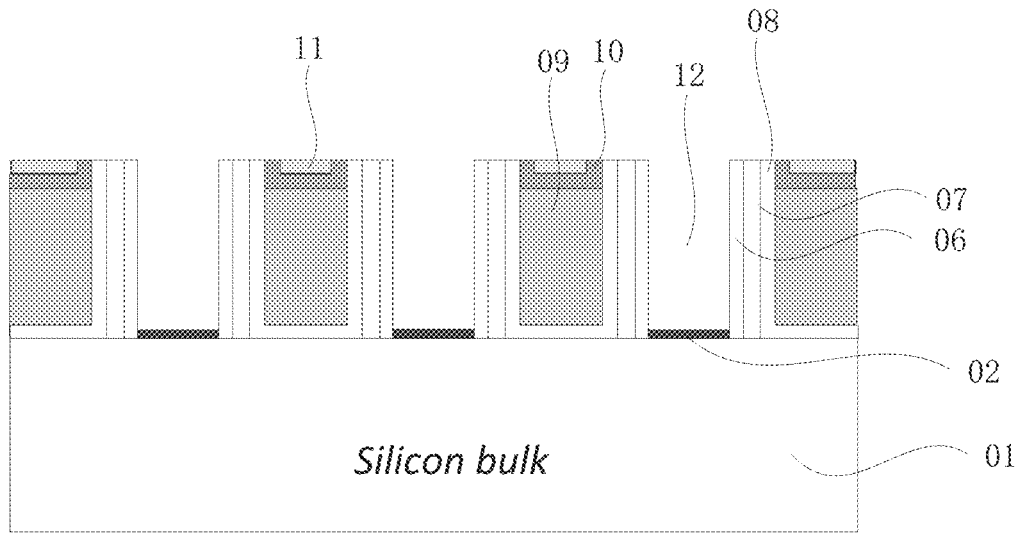

Step 7. The remaining polysilicon structure is removed to form a groove, wherein the IO silicon oxide layer is exposed from the bottom of the groove. Referring to FIG. 7, in step 7, the remaining polysilicon structure is removed to form a groove 12, wherein the IO silicon oxide layer 02 is exposed from the bottom of the groove 12.

Figure 8:
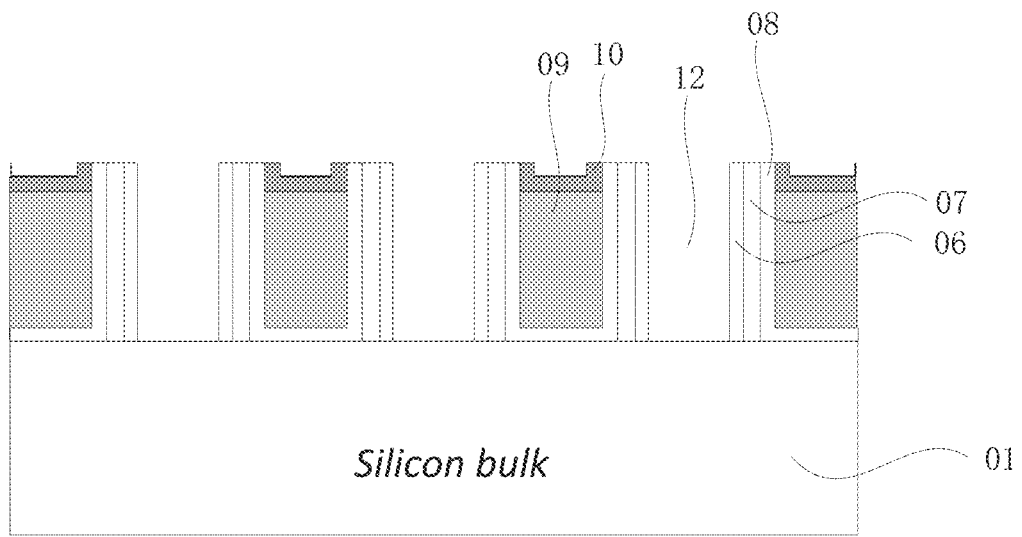

Step 8. The IO silicon oxide layer is removed, wherein the silicon nitride layer covering the upper surface of the first dielectric layer serves as a hard mask such that no loss of the first dielectric layer occurs in a process of removing the IO silicon oxide layer. Referring to FIG. 8, in step 8, the IO silicon oxide layer 02 is removed, wherein the silicon nitride layer 10 covering the upper surface of the first dielectric layer 09 serves as a hard mask such that no loss of the first dielectric layer 09 occurs in a process of removing the IO silicon oxide layer 02. If the silicon nitride layer 10 is not formed on the upper surface of the first dielectric layer, the first dielectric layer 09 may also be etched during a process of etching and removing the IO silicon oxide layer 02, and thus may be damaged.

According to this embodiment of the present application, in step 8, the second dielectric layer within the concave structure is removed at the same time when the IO silicon oxide layer 02 is removed.

To sum up, according to the present application, a silicon nitride hard mask is formed on the first dielectric layer to prevent the loss of the first dielectric layer in a process of removing the IO silicon oxide layer, thus avoiding a loss of the gate height. Therefore, the present application effectively overcomes various defects in the prior art and thus has high industrial utilization value.

The above embodiment merely illustrates the principle and effect of the present application, rather than limiting the present application. Anyone skilled in the art can modify or change the above embodiment without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A method for reducing a loss of a dielectric layer in an IO silicon oxide removal process, at least comprising the following steps:

step 1, providing a semiconductor structure, the semiconductor structure comprising: a silicon bulk, a plurality of gate structures arranged on the silicon bulk and spaced apart from each other, an IO silicon oxide layer located between the bottom of the gate structure and an upper surface of the silicon bulk, and a spacer attached to a side wall of the gate structure;

and depositing an etch stop layer, the etch stop layer covering, in a manner of continuous distribution, the spacer of the side wall of the gate structure, the top of the gate structure, and the upper surface of the silicon bulk between the gate structures, the gate structure being composed of a polysilicon structure, a first hard mask layer, and a second hard mask layer stacked from bottom to top;

step 2, depositing a first dielectric layer to fill a space between the gate structures, and then performing planarization to expose the etch stop layer on the top of the gate structure;

step 3, performing etch back of the first dielectric layer until a height of the remaining first dielectric layer is two-thirds of a height of the polysilicon structure;

step 4, depositing a silicon nitride layer to continuously cover an upper surface of the first dielectric layer and an upper surface of the exposed etch stop layer;

step 5, depositing a second dielectric layer on the silicon nitride layer to fill the space between the gate structures, and then performing planarization to expose the silicon nitride layer on the top of the gate structure;

step 6, performing non-selective etch back to remove the second dielectric layer and the gate structure, the spacer, the etch stop layer, and the silicon nitride layer which are covered by the second dielectric layer, wherein the first dielectric layer, the silicon nitride layer on the upper surface of the first dielectric layer, and the polysilicon structure, the spacer, and the etch stop layer between the first dielectric layers are retained;

step 7, removing the remaining polysilicon structure to form a groove, wherein the IO silicon oxide layer is exposed from the bottom of the groove; and step 8, removing the IO silicon oxide layer, wherein the silicon nitride layer covering the upper surface of the first dielectric layer serves as a hard mask such that no loss of the first dielectric layer occurs in a process of removing the IO silicon oxide layer.

2. The method for reducing the loss of the dielectric layer in the IO silicon oxide removal process according to claim 1, wherein in step 1, the first hard mask layer is silicon nitride; and the second hard mask layer is silicon oxide.

3. The method for reducing the loss of the dielectric layer in the IO silicon oxide removal process according to claim 2, wherein in step 1, the spacer attached to the side wall of the gate structure is composed of a first spacer and a second spacer attached to the first spacer.

4. The method for reducing the loss of the dielectric layer in the IO silicon oxide removal process according to claim 3, wherein in step 1, the first spacer and the second spacer are both silicon nitride.

5. The method for reducing the loss of the dielectric layer in the IO silicon oxide removal process according to claim 4, wherein in step 1, a side wall of the first hard mask layer is fully covered by the first spacer and the second spacer; and a side wall of an upper end portion of the second hard mask layer is not covered by the first spacer or the second spacer.

6. The method for reducing the loss of the dielectric layer in the IO silicon oxide removal process according to claim 5, wherein in step 1, portions of the top of the gate structure covered by the etch stop layer comprise: an upper surface of the gate structure and a side wall of a top end portion of the gate structure which are covered by the etch stop layer; and the above etch stop layer joins the etch stop layer covering the second spacer.

7. The method for reducing the loss of the dielectric layer in the IO silicon oxide removal process according to claim 1, wherein in step 1, the etch stop layer is silicon nitride.

8. The method for reducing the loss of the dielectric layer in the IO silicon oxide removal process according to claim 1, wherein in step 2, the first dielectric layer is silicon oxide; and a method of the planarization is a chemical mechanical polishing method.

9. The method for reducing the loss of the dielectric layer in the IO silicon oxide removal process according to claim 1, wherein in step 5, the second dielectric layer is silicon oxide.

10. The method for reducing the loss of the dielectric layer in the IO silicon oxide removal process according to claim 1, wherein in step 6, after the non-selective etch back for removing the second dielectric layer, the retained silicon nitride layer on the upper surface of the first dielectric layer forms a concave structure, and the second dielectric layer within the concave structure is retained.

11. The method for reducing the loss of the dielectric layer in the IO silicon oxide removal process according to claim 10, wherein in step 8, the second dielectric layer within the concave structure is removed at the same time when the IO silicon oxide layer is removed.

* * * * *